(12) United States Patent
Feil et al.

(10) Patent No.: US 11,444,620 B2
(45) Date of Patent: Sep. 13, 2022

(54) DRIVE CIRCUIT FOR A POWER SEMICONDUCTOR CIRCUIT

(71) Applicant: Siemens Aktiengesellschaft, Munich (DE)

(72) Inventors: Wolfgang Feil, Schwandorf (DE); Hauke Nannen, Nuremberg (DE); Tobias Andersch, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/577,725

(22) Filed: Jan. 18, 2022

(65) Prior Publication Data
US 2022/0239291 A1 Jul. 28, 2022

(30) Foreign Application Priority Data
Jan. 26, 2021 (DE) .......................... 102021200677.9

(51) Int. Cl.
*H03K 17/082* (2006.01)
*H03K 17/78* (2006.01)
(Continued)

(52) U.S. Cl.
CPC ............ *H03K 17/689* (2013.01); *H02M 1/08* (2013.01); *H03K 17/785* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 5,612,582 A | * | 3/1997 | Shichi .............. | H03K 17/04206 307/130 |
| 6,555,935 B1 | * | 4/2003 | Maskovyak ..... | H03K 17/04123 307/125 |
| 7,095,267 B2 | * | 8/2006 | Sato ..................... | H03K 17/785 250/552 |

FOREIGN PATENT DOCUMENTS

DE 102019107506 A1 10/2020

OTHER PUBLICATIONS

German Office Action and English translation thereof dated Jul. 10, 2021.

(Continued)

*Primary Examiner* — Kenneth B Wells
(74) *Attorney, Agent, or Firm* — Harness, Dickey & Pierce, P.L.C.

(57) ABSTRACT

A drive circuit for a power semiconductor circuit may include input contact means for inputting a control signal, the control signal representing a switching command for the power semiconductor circuit, and also at least one output contact means, to which the power semiconductor circuit is connectable and which serves for outputting a switching signal to the power semiconductor circuit. Furthermore, the drive circuit comprises current path connection means for connecting the drive circuit to a current path to be switched by the power semiconductor circuit, and means for galvanically isolating the input contact means from the output contact means and the current path connection means. Circuit means which output a switching signal that switches on the power semiconductor circuit if a control signal representing the switch-on command for the power semiconductor circuit is input at the input contact means and also voltage is present at the current path connection means.

8 Claims, 1 Drawing Sheet

(51) Int. Cl.
*H03K 17/687* (2006.01)
*G01R 31/00* (2006.01)
*H03K 17/689* (2006.01)
*H03K 17/785* (2006.01)
*H02M 1/08* (2006.01)

(56) References Cited

OTHER PUBLICATIONS

German Decision to Grant and English translation thereof dated Oct. 14, 2021.

\* cited by examiner

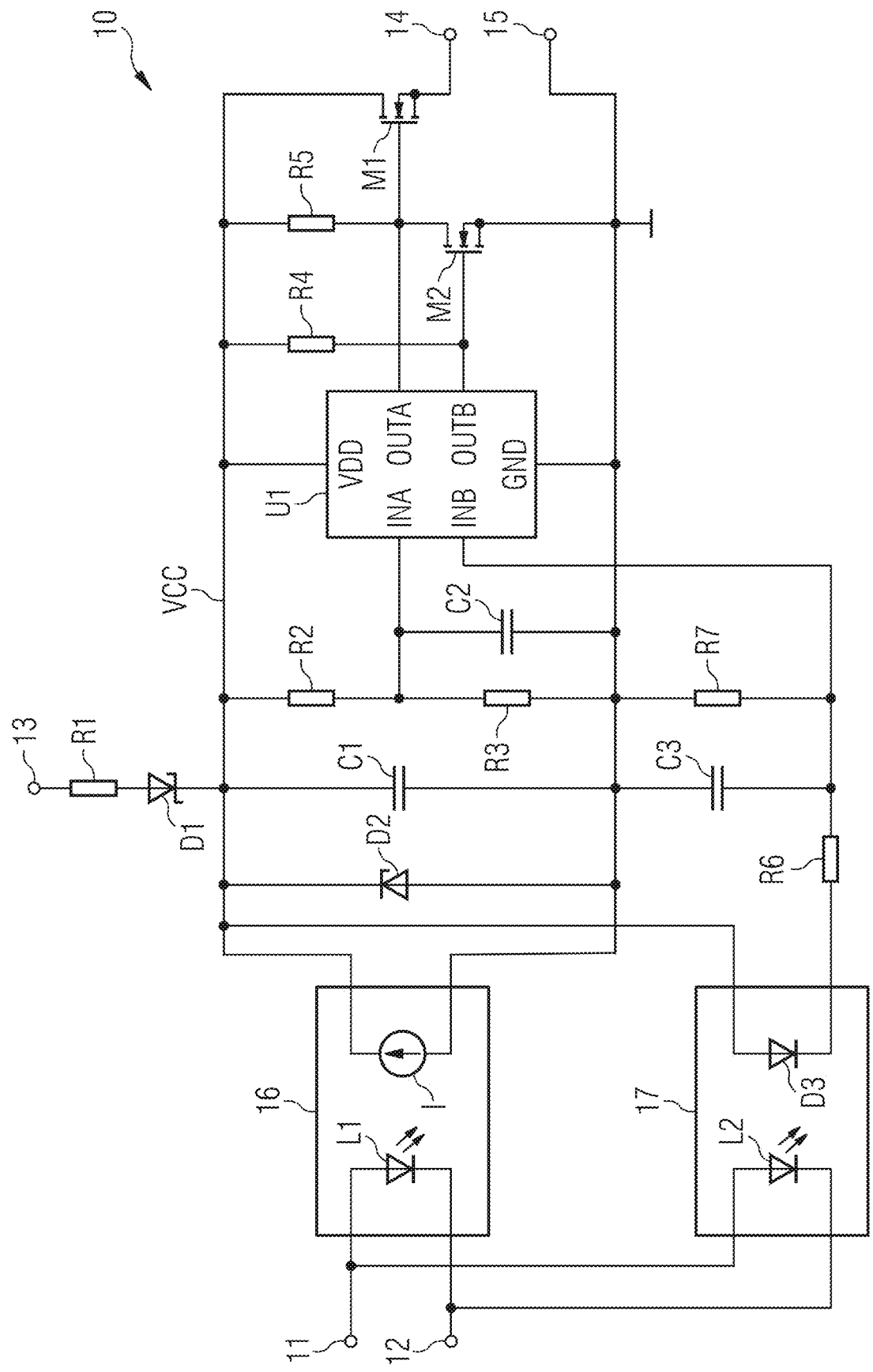

DRIVE CIRCUIT FOR A POWER SEMICONDUCTOR CIRCUIT

PRIORITY STATEMENT

The present application hereby claims priority under 35 U.S.C. § 119 to German patent application number DE 102021200677.9 filed Jan. 26, 2021, the entire contents of which are hereby incorporated herein by reference.

FIELD

At least some example embodiments generally relate to drive circuits for power semiconductor circuits.

BACKGROUND

Many electrical drives, especially in industrial application, are regulated by way of frequency converters. The drives are traditionally supplied by means of AC voltage, which firstly has to be rectified such that a variable voltage and frequency can be made available for the drive by way of the frequency converter. Since the rectification is accompanied by losses, DC voltage networks are used for example for production installations comprising many drives. The DC voltage networks furthermore afford the advantage that an infeed from local photovoltaic installations can take place without the detour via AC voltage.

As in all electrical applications, reliable switching is of important for DC voltage networks (hereinafter: DC networks) as well. For this purpose, use is made of electronic relays or electronic contactors comprising a voltage-controlled power semiconductor switch, for example an insulated gate bipolar transistor (hereinafter: IGBT). These power semiconductor switches have a low power loss in the completely switched-off state and in the completely turned-on, i.e., fully switched-on, state, but are susceptible to being destroyed by excessively high power losses that may occur in the intervening switching states.

DE 10 2019 107 506 A1 discloses a driver circuit. The latter has a control signal input for receiving a first control signal at a first circuit input, an optocoupler connected to the control signal input and designed to generate a galvanically decoupled second control signal according to the first control signal, an output circuit for driving at least one circuit output connection of the driver circuit according to a third control signal, and an electronic control circuit having an energy supply, an input for receiving the second control signal and an output for outputting the third control signal according to the second control signal received at the input.

SUMMARY

Power semiconductor switches may have a low power loss in the completely switched-off state and in the completely turned-on, i.e., fully switched-on, state, but are susceptible to being destroyed by excessively high power losses that may occur in the intervening switching states.

According to at least one example embodiment, a drive circuit for a power semiconductor circuit includes input contact means for inputting a control signal representing a switching command for the power semiconductor circuit, at least one output contact means, to which the power semiconductor circuit is connectable, for outputting a switching signal to the power semiconductor circuit, current path connection means for connecting the drive circuit to a current path to be switched by the power semiconductor circuit, means for galvanically isolating the input contact means from the output contact means and the current path connection means, circuit means which output a switching signal that switches on the power semiconductor circuit if a control signal representing a switch-on command for the power semiconductor circuit is input at the input contact means and a voltage is present at the current path connection means, wherein the circuit means comprise a monitoring circuit for the supply voltage of the drive circuit, the circuit means configured to operate such that the switching signal that switches on the power semiconductor circuit is output for the first time if the supply voltage exceeds a threshold value and a control signal representing the switch-on command for the power semiconductor circuit is input at the input contact means, a switching signal that keeps the power semiconductor circuit in the switched-on state is output when a control signal representing the switch-on command for the power semiconductor circuit is input at the input contact means, and a switching signal that switches on the power semiconductor circuit is not output if the supply voltage is below the threshold value and the control signal representing the switch-on command for the power semiconductor circuit is not received by the input contact means.

In at least one example embodiment, the drive circuit further comprises a means which, from the control signal input, photovoltaically provides an electrical energy to operate the drive circuit, wherein the circuit means are configured such that the switching signal that switches on the power semiconductor circuit for the first time is not output if the drive circuit is fed only by the photovoltaically provided electrical energy.

According to at least one example embodiment, the circuit means are configured to output the switching signal that switches on the power semiconductor circuit after said switching signal has been output for the first time based on the energy provided by the means.

According to at least one example embodiment, the drive circuit further includes an electrical energy storage unit, the electrical energy storage unit being chargeable by at least one of the energy generated photovoltaically from the control signal input or by an energy fed in via the current path connection means and, in a charged state, provides switching energy for switching on the power semiconductor circuit.

According to at least one example embodiment, the current path connection means is configured to receive the supply voltage.

According to at least one example embodiment, the monitoring circuit comprises a comparator having a first input and a first output, wherein a LOW level is present at the first output if the voltage at the first input falls below a first threshold value and otherwise a HIGH level is present at the first output or the first output is at high impedance, the first output is coupled to a first electronic switching means, which switches the supply voltage through to one of the output contact means in the event of a HIGH level at the first output of the comparator or in the event of a high-impedance state of the first output of the comparator and is at high impedance in the event of a LOW level at the first output of the comparator; and a voltage divided from the supply voltage of the circuit is fed in via a voltage divider at the first input.

According to at least one example embodiment, the comparator of which comprises a second input and a second output, wherein a LOW level is present at the second output if the voltage at the second input exceeds a second threshold value and otherwise a HIGH level is present at the second output or the second output is at high impedance;

the second output is coupled to a second electronic switching means, which switches the input of the first electronic switching means through to ground in the event of a high level at the second output of the comparator or in the event of a high-impedance state of the second output of the comparator and is at high impedance in the event of a LOW level at the second output of the comparator; and at the second input the supply voltage is present or a voltage is fed in via a voltage divider if a control signal representing the switch-on command is present at the input contact means and otherwise no signal or ground is present at the second input.

According to at least one example embodiment, a semiconductor contactor comprising the drive circuit according to at least one example embodiment.

According to at least one example embodiment, a drive circuit for a power semiconductor circuit. The drive circuit includes at least one input contact configured to receive a control signal, the control signal representing a switching command for the power semiconductor circuit, at least one output contact, to which the power semiconductor circuit is connectable, for outputting a switching signal to the power semiconductor circuit, a current path connector configured to connect the drive circuit to a current path to be switched by the power semiconductor circuit, at least one isolation element configured to galvanically isolate the at least one input contact from the output contact and the current path connector, circuitry configured to output a switching signal that switches on the power semiconductor circuit if a control signal representing a switch-on command for the power semiconductor circuit is input at the at least one input contact and also a voltage is present at the current path connector, wherein the circuitry includes a monitoring circuit for a supply voltage of the drive circuit, the circuitry configured to operate such that the switching signal that switches on the power semiconductor circuit is output for a first time if the supply voltage exceeds a threshold value and a control signal representing the switch-on command for the power semiconductor circuit is received at the at least one input contact, a switching signal that keeps the power semiconductor circuit in the switched-on state is output when a control signal representing the switch-on command for the power semiconductor circuit is received at the at least one input contact, and a switching signal that switches on the power semiconductor circuit is not output if the supply voltage is below the threshold value and the control signal representing the switch-on command for the power semiconductor circuit is not received by the at least one input contact.

According to at least one example embodiment, the drive circuit further includes a photovoltaic element configured to provide an electrical energy to operate the drive circuit, wherein the circuitry is configured such that the switching signal that switches on the power semiconductor circuit for the first time is not output if the drive circuit is fed only by the photovoltaically provided electrical energy.

According to at least one example embodiment, the circuitry is configured to continue to output the switching signal that switches on the power semiconductor circuit after said switching signal has been output for the first time based on energy provided by the at least one isolation element.

According to at least one example embodiment, the drive circuit further includes an electrical energy storage unit, the electrical energy storage unit being chargeable by at least one of an energy generated photovoltaically from the control signal input or by an energy fed in via the current path connector and, in a charged state, provides switching energy for switching on the power semiconductor circuit.

According to at least one example embodiment, the current path connector is configured to receive the supply voltage.

According to at least one example embodiment, the monitoring circuit comprises a comparator having a first input and a first output, wherein a LOW level is present at the first output if the voltage at the first input falls below a first threshold value and otherwise a HIGH level is present at the first output or the first output is at high impedance, the first output is coupled to a first electronic switch, which switches the supply voltage through to one of the output contacts in the event of a HIGH level at the first output of the comparator or in the event of a high-impedance state of the first output of the comparator, and is at high impedance in the event of a LOW level at the first output of the comparator; and a voltage divided from the supply voltage of the circuit is fed in via a voltage divider at the first input.

According to at least one example embodiment, the comparator of which comprises a second input and a second output, wherein a LOW level is present at the second output if the voltage at the second input exceeds a second threshold value and otherwise a HIGH level is present at the second output or the second output is at high impedance;

the second output is coupled to a second electronic switch, which switches the input of the first electronic switch through to ground in the event of a high level at the second output of the comparator or in the event of a high-impedance state of the second output of the comparator, and the second output is at high impedance in the event of a LOW level at the second output of the comparator; and the second input receives the supply voltage or a voltage via a voltage divider if a control signal representing the switch-on command is present at the at least one input contact and otherwise no signal or ground is present at the second input.

BRIEF SECTION OF THE DRAWINGS

The following accompanying drawing is merely intended to illustratively describe and explain example embodiments and do not limit the scope of example embodiments. In the sole FIGURE, The sole FIGURE is a drive circuit for a power semiconductor switch or a semiconductor contactor according to at least one example embodiment.

DETAILED DESCRIPTION

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Specific structural and functional details disclosed herein are merely representative for purposes of describing example embodiments of the present invention. This invention may, however, be embodied in many alternate forms and should not be construed as limited to only the embodiments set forth herein.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one example embodiment provides a drive circuit for a power semiconductor circuit which ensures a galvanic isolation between control circuit and main current path and reliably avoids switching states between ON and OFF.

According to at least one example embodiment, a drive circuit for a power semiconductor circuit comprises an input contact means for inputting a control signal representing a switching command, in particular a switch-on command, for the power semiconductor circuit, and comprises at least one output contact means, to which the power semiconductor circuit is connectable and via which a switching signal, in particular a switching-on switching signal, is able to be output to the power semiconductor circuit. Furthermore, current path connection means for connecting the drive circuit to a current path to be switched by the power semiconductor circuit are present. The input contact means of the drive circuit are galvanically isolated from the output contact means and the current path connection means. The drive circuit has circuit means which output a switching signal that switches on the power semiconductor circuit if a control signal representing the switch-on command for the power semiconductor circuit is input at the input contact means and also voltage is present at the current path connection means. Otherwise the circuit means do not output a switching signal that switches on the power semiconductor circuit. In this case, the circuit means comprise a monitoring circuit for the supply voltage of the drive circuit, which has the effect that the switching signal that switches on the power semiconductor circuit is output for the first time if the supply voltage exceeds a threshold value and a control signal representing the switch-on command for the power semiconductor circuit is input at the input contact means, a switching signal that keeps the power semiconductor circuit in the switched-on state is furthermore output as long as a control signal representing the switch-on command for the power semiconductor circuit is input at the input contact means, and otherwise a switching signal that switches on the power semiconductor circuit is not output.

In other words, the drive circuit ensures that the power semiconductor switch, which may also be referred to as a semiconductor contactor, can only ever be switched into the ON state if the drive circuit is actually available and can operate correctly. Destruction of the power semiconductor is thus avoided since the drive circuit outputs a switching signal only if the drive circuit is able actually to carry out the switching process reliably, that is to say for example enough energy is available for the switching process, which, in a greatly generalized way, may be regarded as charge reversal of a capacitance.

According to at least one example embodiment, the drive circuit comprises a means which, from the control signal input, photovoltaically provides an electrical energy sufficient for the operation of the drive circuit. The circuit means are configured such that a switching signal that switches on the power semiconductor circuit for the first time is not output if the drive circuit is fed solely by the photovoltaically provided electrical energy.

In other words, the drive circuit ensures that an electrical energy derived from a switch-on command is sufficient to operate the drive circuit, but no change from a non-switching-on signal to a switching-on signal takes place at the output as long as the drive circuit is supplied only by the electrical energy derived from the switch-on command.

In at least one example embodiment, firstly the control signal is converted into light, for example by means of an LED, and then a voltage is generated from this light signal by means of a photovoltaic element. Advantageously, the control circuit is galvanically isolated from the main electrical circuit in this way, which constitutes a central requirement in many applications and, in the case of semiconductor contactors, unlike in the case of electromechanical contactors, is not already afforded by the contactor itself.

According to at least one example embodiment, the drive circuit is configured such that solely the energy provided photovoltaically by the abovementioned means is sufficient for continuing to output a switching signal that switches on the power semiconductor circuit, or keeps it switched on, after said switching signal has been output for the first time.

In other words, the drive circuit is dimensioned such that the electrical energy derived from a switch-on command is not sufficient for switching on the power semiconductor switch by way of a change from a non-switching-on signal to a switching-on signal at the output (i.e., for charge reversal of the capacitance constituted by the power semiconductor switch), but is sufficient to ensure that a power semiconductor, once switched on, is still kept switched on.

The circuit means mentioned above, in particular comprising an integrated component, are provided, which monitor the drive circuit and evaluate the total available voltage and, on the basis of this evaluation, decide whether the power semiconductor switch or the semiconductor contactor can actually be switched on, i.e., whether enough electrical energy is available to allow complete and sufficiently rapid charge reversal of the capacitance constituted by the power semiconductor switch.

Further advantageous developments of the invention are specified in the rest of the dependent claims.

At least some example embodiments furthermore relate to a semiconductor contactor comprising a drive circuit as described above.

Example embodiments are explained in greater detail below with reference to a drawing.

The sole FIGURE shows a drive circuit 10 for a power semiconductor switch or a semiconductor contactor in a schematic illustration, wherein the illustration of the power semiconductor switch or semiconductor contactor is omitted for the sake of simplification. The illustration of circuit means which ensure a reliable switch-off of the power semiconductor, i.e., a sufficiently rapid discharge of the capacitance constituted by the power semiconductor switch, has likewise been dispensed with. Such circuit means that ensure the reliable switch-off of the power semiconductor can be provided in diverse embodiments by a person skilled in the relevant art, without exercising inventive skill.

The drive circuit 10 comprises two input contacts 11, 12, via which a control signal is able to be input, which the control signal can represent at least one switch-on command for the power semiconductor circuit and, in at least some example embodiments, additionally or alternatively a switch-off command. Said signal is conducted in parallel to two galvanically isolating components 16, 17, wherein a first galvanically isolating component 16 comprises a first LED L1 and a photovoltaic cell I, which generates an electrical energy from a light signal generated by the LED L1 in response to a control voltage at the contacts 11, 12.

Said energy is provided at the output of the component 16 and can serve as supply voltage for the rest of the drive circuit. A diode, such as a Zener diode D2, serves for stabilizing the supply voltage VCC of the circuit 10 supplied by component 16, inter alia.

A second galvanically isolating component 17 comprises a second LED L2 and a photodiode D3, or alternatively a phototransistor, which becomes conducting if a control voltage is present at the contacts 11, 12. In this case, via a voltage divider formed from two resistors R6, R7, a voltage stabilized by a capacitor C3 is provided to a second input INB of a comparator component U1. In at least one example embodiment, the dimensioning of the voltage divider R6, R7 and of the capacitor C3 at the second input INB can be implemented like the dimensioning—described further below—of the voltage divider R2, R3 and of the capacitor C2 at the first input INA.

The drive circuit comprises a current path connection means 13 (e.g., a device for electrically connecting the drive circuit to a current path (a current path connector) such as a fixed connection, a switch, a transistor, etc.), via which the drive circuit 10 is connected to the current path (not illustrated) to be switched by the power semiconductor switch; specifically, the current path connection means 13 are connected to the supply side of the current path, which has the consequence that a voltage is present at the connection means 13 when (and only when) a voltage to be switched is present on the current path. By contrast, if the current path is deactivated for example by a superordinate switching means or is deenergized for other reasons, no voltage is present at the connection means 13. The voltage to be switched may be a DC voltage. The current path may refer to a main line, wire and/or conductor.

Via a first resistor R1 (which can be a series connection of a plurality of resistors) and a first diode D1, such as a Schottky diode, the connection means 13 is connected to VCC of the drive circuit 10 and supplies electrical energy to the drive circuit 10 as long as the power semiconductor switch is switched off. Once the power semiconductor switch has been switched on, energy for the purposes of supplying the drive circuit 10 can no longer be drawn from the connection means 13.

A first capacitor C1 substantially serves as an energy storage unit for the switching process. C1 is charged by the two voltage or energy sources connected in parallel, i.e., firstly the component 16 and secondly the connection means 13.

A voltage divider comprising a second resistor R2 and a third resistor R3 firstly divides the voltage VCC and passes this divided voltage to a first input INA of the comparator component U1 and additionally provides for a defined load on the voltage VCC.

In this case, the individual values R2 and R3 are chosen such that the corresponding comparator threshold value is exceeded at INA if VCC has reached a sufficiently high value, which corresponds to enough energy for the switching process of the power semiconductor switch, said energy being stored in C1.

In this case, C1 and also the sum of R2 and R3 are chosen such that the load function on VCC has the effect that the voltage at INA cannot reach the comparator threshold value if VCC is fed solely from the component 16. The voltage generation from the cell I of the component 16 is at high impedance and the value of this internal resistance determines the value R2+R3 for which VCC is just high enough to ensure the operation of U1, and on the other hand is low enough that the voltage divided in accordance with VCC*R3/(R2+R3) at INA does not reach the switching threshold value of this input.

A second capacitor C2 serves for stabilizing the voltage input at the input INA of the comparator U1 and may have a capacitance C2=2.2 nF. In the same way, in example embodiments, the third capacitor C3 serves for stabilizing the voltage input at the input INB of the comparator U1 and likewise may have a capacitance of C3=2.2 nF.

In one example embodiment, with regard to the voltage fed in via the connection means 13, it is possible to adopt a procedure similar to that with the voltage provided via the component 16 in that R1, in comparison with the sum of R2 and R3, is chosen to have a magnitude such that the voltage VCC resulting from the voltage divider formed from R1 and R2+R3 is sufficient for the operation of U1, but upon further division in accordance with VCC*R3/(R2+R3) at INA does not reach the switching threshold value of this input.

In this example embodiment, it is only when voltage is provided both at connection means 13 and by component 16 that enough energy is fed into the drive circuit in order that, despite the current flow through R2+R3, VCC is raised and C1 is correspondingly charged to such an extent that the switching threshold value is exceeded at INA.

In this exemplary embodiment, therefore, suitable selection of the diodes D1, D2 and the resistors R1, R2, R3 ensures that the threshold value is exceeded at INA of the comparator U1 only if an ON switching command is present at the input contacts 11, 12 and also the current path is energized. The comparator U1 could then provide directly for switching through the switching energy from C1 to the power semiconductor.

The components 17, INB, OUTB, R4, R5, R6, R7, C3, M2 are optional in some example embodiments, but can be used for improving the reliability in as well.

An example multiple voltage divider R1, R2, R3 is for example R1=600 kΩ, R2=4.7 MΩ and R3=91 kΩ. As already mentioned, the voltage divider R6, R7 can be selected like the voltage divider R2, R3, i.e., R6=4.7 MΩ and R7=91 kΩ.

In another example embodiment, the dimensioning of R1 may be in relation to R2+R3 such that the voltage or respectively energy fed in at the connection means 13 charges C1 and raises VCC to a value that causes the voltage divided in accordance with VCC*R3/(R2+R3) at INA to reach the switching threshold value of this input. However, without further measures, the switching process would thus be triggered without a switching command, which would be a malfunction of the drive circuit 10.

Therefore, the comparator U1 comprises a further input INB, at which, a voltage is input, the value of which results from VCC and the division ratio of R6 and R7, if an ON switching command is input at the input contacts 11, 12.

U1 processes the inputs at INA and INB as follows:

a LOW level is present at a first output OUTA if the voltage at INA falls below a first threshold value. Otherwise (i.e., if the voltage at INA is greater than or equal to the threshold value) OUTA is in the high-impedance state. In other exemplary embodiments, instead of the high-impedance state, a HIGH level is present at OUTA.

A LOW level is present at a second output OUTB if the voltage at INB exceeds a second threshold value. Otherwise (i.e., if the voltage at INB is less than or equal to the threshold value or INB is unconnected/at high impedance)

OUTB is in the high-impedance state. In other exemplary embodiments, instead of the high-impedance state, a HIGH level is present at OUTB.

Specific types of window comparators can be used as U1. One particularly suitable comparator of this type is TPS3701 from Texas Instruments, which functions reliably with a very wide range of supply voltages (1.8 V to 36 V) and has a very low current consumption (less than 10 μA). The threshold voltages at INA and INB are in each case approximately 400 mV, specifically independently of VCC.

A first electronic switch, such as a field effect transistor M1, is connected to OUTA, specifically such that at a positive output connection 14 of the drive circuit M1 provides VCC as switching signal for switching the semiconductor contactor if a LOW signal is not output by OUTA, i.e., if the voltage at INA exceeds the threshold value, which indicates that VCC has exceeded the required minimum value and enough energy is available from C1 for completely and rapidly turning on the semiconductor contactor (i.e., substantially for complete charge reversal of the capacitance thereof). A ground output connection 15 can be provided, which supplies the reference potential for the positive output connection 14. If the semiconductor contactor and the drive circuit 10 are connected to a common ground, the ground output connection 15 can be omitted.

For the case where a HIGH signal is not output at OUTA, if the voltage at INA is greater than or equal to the threshold value, rather OUTA, as described above, is at high impedance in this case, a resistor R5 provides for a pull-up of the control input of the electronic switch M1 and thus for switching on the electronic switch M1, provided that a LOW signal is not output at OUTA.

As already explained, in at least one example embodiment, a second signal path is provided for the switching command. If said switching command is not present, i.e., the voltage at INB lies below the threshold value, then a LOW signal is not present at OUTB.

OUTB is connected to a second electronic switch, such as a field effect transistor M2.

For the case where a HIGH signal is not output at OUTB, if the voltage at INB is less than or equal to the threshold value, rather OUTB, as described above, is at high impedance in this case, a resistor R4 provides for a pull-up of the control input of the electronic switch M2 and thus for switching on the electronic switch M2, provided that a LOW signal is not output at OUTB.

In response to OUTB being in the high-impedance state or alternatively a HIGH signal being present at OUTB, a conductive connection is established between the control connection of M1 and ground and thus a HIGH signal possibly output at OUTA is deactivated or, if OUTA is at high impedance, the pull-up effect of the resistor R5 is deactivated. Conversely, a switching command at the input terminals 11, 12 via the component 17 has the effect that a voltage is present at INB and OUTB is correspondingly controlled to LOW, whereupon M2 is turned off and does not adversely affect the state of OUTA, such that a HIGH signal possibly output by OUTA or a high-impedance state possibly prevailing there results in the turn-on of M1 and thus in the switching of the semiconductor contactor.

In at least one example embodiment, the values for R4 and R5 arise in accordance with the recommendations of the manufacturer of TPS3701, to which reference is made here in this respect.

It should be pointed out that other circuit means and in particular using other comparator components instead of TPS3701, and that the dimensioning of the circuit described here and of its modifications can be straightforwardly adapted to the specific conditions, in particular to the voltage to be switched at connection means 13 and to the switching energy required for the respective semiconductor contactor, by a person skilled in the art.

For the example embodiments described above, the drive circuit functionally accomplishes the following: switch-on of the semiconductor contactor when and only when a switch-on command is input at the connection 11, 12 and also enough energy for reliably switching the semiconductor contactor has been fed into the drive circuit via connection means 13; then leaving the semiconductor contactor switched on as long as the switch-on command is present at the terminals 11, 12; and deactivating the switching signal that switches on the contactor as soon as a switch-on command is no longer present at the terminals 11, 12, and once again activating the switching signal that switches on the contactor when and only when once again a switch-on command is input at the connection 11, 12 and also enough energy for reliably switching the semiconductor contactor has been input into the drive circuit via connection 13.

The invention claimed is:

1. A drive circuit for a power semiconductor circuit, comprising:
   input contact means for inputting a control signal, the control signal representing a switching command for the power semiconductor circuit;
   at least one output contact means, to which the power semiconductor circuit is connectable, for outputting a switching signal to the power semiconductor circuit;
   current path connection means for connecting the drive circuit to a current path to be switched by the power semiconductor circuit;
   means for galvanically isolating the input contact means from the output contact means and the current path connection means
   circuit means which output a switching signal that switches on the power semiconductor circuit if a control signal representing a switch-on command for the power semiconductor circuit is input at the input contact means and a voltage is present at the current path connection means, wherein the circuit means comprise a monitoring circuit for the supply voltage of the drive circuit, the circuit means configured to operate such that
   the switching signal that switches on the power semiconductor circuit is output for the first time if the supply voltage exceeds a threshold value and a control signal representing the switch-on command for the power semiconductor circuit is input at the input contact means,
   a switching signal that keeps the power semiconductor circuit in the switched-on state is output when a control signal representing the switch-on command for the power semiconductor circuit is input at the input contact means, and
   a switching signal that switches on the power semiconductor circuit is not output if the supply voltage is below the threshold value and the control signal representing the switch-on command for the power semiconductor circuit is not received by the input contact means.

2. The drive circuit as claimed in claim 1, comprising:
   a means which, from the control signal input, photovoltaically provides an electrical energy to operate the drive circuit, wherein the circuit means are configured such that the switching signal that switches on the power semiconductor circuit for the first time is not output if the drive circuit is fed only by the photovoltaically provided electrical energy.

3. The drive circuit as claimed in claim 2, the circuit means are configured to output the switching signal that switches on the power semiconductor circuit after said switching signal has been output for the first time based on the energy provided by the means.

4. The drive circuit as claimed in claim 2, further comprising:
   an electrical energy storage unit, the electrical energy storage unit being chargeable by at least one of the energy generated photovoltaically from the control signal input or by an energy fed in via the current path connection means and, in a charged state, provides switching energy for switching on the power semiconductor circuit.

5. The drive circuit as claimed in claim 2, wherein the current path connection means is configured to receive the supply voltage.

6. The drive circuit as claimed in claim 2, wherein the monitoring circuit comprises a comparator having a first input and a first output, wherein
   a LOW level is present at the first output if the voltage at the first input falls below a first threshold value and otherwise a HIGH level is present at the first output or the first output is at high impedance;
   the first output is coupled to a first electronic switching means, which
      switches the supply voltage through to one of the output contact means in the event of a HIGH level at the first output of the comparator or in the event of a high-impedance state of the first output of the comparator and
      is at high impedance in the event of a LOW level at the first output of the comparator; and
   a voltage divided from the supply voltage of the circuit is fed in via a voltage divider at the first input.

7. The drive circuit as claimed in claim 6, the comparator of which comprises a second input and a second output, wherein
   a LOW level is present at the second output if the voltage at the second input exceeds a second threshold value and otherwise a HIGH level is present at the second output or the second output is at high impedance;
   the second output is coupled to a second electronic switching means, which
      switches the input of the first electronic switching means through to ground in the event of a high level at the second output of the comparator or in the event of a high-impedance state of the second output of the comparator and
      is at high impedance in the event of a LOW level at the second output of the comparator; and
      at the second input the supply voltage is present or a voltage is fed in via a voltage divider if a control signal representing the switch-on command is present at the input contact means and otherwise no signal or ground is present at the second input.

8. A semiconductor contactor comprising the drive circuit of claim 1.

* * * * *